(12) United States Patent
Melgaard

(10) Patent No.: US 6,879,779 B2
(45) Date of Patent: Apr. 12, 2005

(54) ANNEALING OVEN WITH HEAT TRANSFER PLATE

(75) Inventor: Hans L. Melgaard, North Oaks, MN (US)

(73) Assignee: Despatch Industries Limited Partnership, Lakeville, MN (US)

( * ) Notice: Subject to any disclaimer, the term of this patent is extended or adjusted under 35 U.S.C. 154(b) by 0 days.

(21) Appl. No.: 10/428,397

(22) Filed: Apr. 30, 2003

(65) Prior Publication Data

US 2004/0218913 A1 Nov. 4, 2004

(51) Int. Cl.[7] .................................................. A21B 2/00
(52) U.S. Cl. ........................ 392/416; 392/418; 219/390; 219/405; 219/411; 118/724; 118/725; 118/50.1
(58) Field of Search ................................. 219/390, 405, 219/411; 392/416, 418; 118/724, 725, 50.1, 728, 729

(56) References Cited

U.S. PATENT DOCUMENTS

| | | |
|---|---|---|
| 1,102,197 A | 6/1914 | Knox |
| 4,161,959 A | 7/1979 | Jansen et al. |
| 4,427,378 A | 1/1984 | Bowers |
| 4,660,593 A | 4/1987 | Langhe |
| 4,787,844 A | 11/1988 | Hemsath |
| 4,840,559 A | 6/1989 | Hemsath |
| 5,256,061 A | 10/1993 | Cress |
| 5,421,892 A * | 6/1995 | Miyagi ........................ 118/724 |
| 6,013,905 A | 1/2000 | Oster |
| 6,741,804 B2 * | 5/2004 | Mack et al. ................. 392/416 |

OTHER PUBLICATIONS

Brochure, "Magnetic Annealing Tool", Despatch Industries, L.L.P., 6 pp. (date unknown, but believed to be early 1998).

* cited by examiner

Primary Examiner—Shawntina Fuqua
(74) Attorney, Agent, or Firm—Fredrikson & Byron, P.A.

(57) ABSTRACT

A vacuum oven with heat transfer fluid conduits. The oven of the invention generally includes a shell into which a removable rack may be placed. The rack has at least one plate which may be heated or cooled by a plate fluid conduit in contact with the plate and through which a heating or cooling fluid may be passed. Work pieces may be loaded in the rack, the rack placed in the shell, the shell sealed, and a vacuum drawn within the shell. The work pieces loaded on the rack are primarily heated and cooled by conductive and radiant heat transfer because of the limited amount of thermally conductive gases within the shell.

36 Claims, 5 Drawing Sheets

ANNEALING OVEN WITH HEAT TRANSFER PLATE

FIELD OF THE INVENTION

The invention is directed to an annealing oven for magnetic and non-magnetic heat processing of work pieces, and to techniques for providing improved heat transfer therewith.

BACKGROUND OF THE INVENTION

Annealing ovens are used in a variety of commercial and industrial applications. In some of these applications, the annealing process includes imparting a magnetic orientation to the products or objects in the oven. For example, magnetic vacuum ovens have been used for magnetic annealing in the manufacture of devices such as read/write heads for rigid media storage devices, e.g., magnetic resistive (MR) and giant magnetic resistive (GMR) heads, disk drives, "MRAM" wafers, and the like. Such magnetic media are referred to as work pieces and are generally in the form of wafers or disks. Work pieces are typically formed of a substrate bearing magnetic film or layers to which a particular magnetic orientation has been imparted through exposure to magnetic fields at elevated temperatures. The process of imparting a particular magnetic orientation in this manner is known as annealing or magnetic annealing.

In the magnetic annealing process, the work pieces are heated to make them more susceptible to magnetic fields. The magnetic film or layers contain ferromagnetic material having a crystalline structure. Raising the temperature increases the vibrational moments of atoms forming the crystalline structure of the magnetic material and imparts a randomness to the motion of the atoms, weakening the crystalline structure of the ferromagnetic material in the magnetic film or layers. This places the atoms in a state that provides minimal resistance to the influence of an outside magnetic field. Exposing the heated wafers to a magnetic field causes the atoms to be held in place or oriented along the axis of the magnetic field. After subjecting the atoms or crystals of the magnetic media to elevated temperatures in the presence of a magnetic field of a desired strength for a prescribed period of time, the wafers are cooled, thus fixing or locking the atoms or crystals in the orientation imparted by the magnetic field. Thus, magnetic annealing involves both heating the media and subjecting the media to a magnetic field so as to orient the crystals of the magnetic film or layers thereof. This annealing operation is often performed with the magnetic media under vacuum conditions or in the presence of an inert atmosphere to minimize oxidation of the work pieces while they are at the elevated temperature.

The magnetic annealing process may be carried out on a single work piece or on multiple work pieces in batches or lots. The magnetic field can be generated by a permanent magnet, electromagnet or superconducting electro-magnet. Such magnets have been incorporated into vacuum ovens. However, permanent magnets are heat sensitive, losing their magnetism at temperatures above their Curie point, and hence should not be positioned too closely to sources of heat. Though permanent magnets are utilized, electromagnets and superconducting electro-magnets are particularly well suited for placement external to the chamber of a vacuum oven.

SUMMARY OF THE INVENTION

The present invention is directed to annealing ovens for use in magnetic and non-magnetic processing applications requiring controlled or rapid heating and cooling times. The oven of the invention generally comprises a shell into which a removable rack may be placed. The rack has at least one plate which may be heated or cooled by a plate fluid conduit in contact with the plate and through which a heating or cooling fluid may be passed. Work pieces may be loaded in the rack, the rack placed in the shell, the shell sealed, and a vacuum drawn within the shell.

In an embodiment of the invention, the shell has a shell opening with a shell flange covering the opening and the shell flange further having an opening for receiving a rack. The rack has at least one plate and pillars which support work pieces. The plate is in contact with a plate fluid conduit that is adapted to receive heating and/or cooling gases. When the rack is installed in the shell a seal flange forms a tight seal with the shell flange to form a tightly sealed processing environment.

In one embodiment, a vacuum may be induced in the processing environment and heat may be applied from an external heater disposed outside of the shell as well as from hot fluids passed though the plate fluid conduit. The work pieces may then be cooled by cooling the plate with cooling fluid passed through the plate fluid conduit. This method of cooling the rack and the work pieces while under a vacuum environment provides the advantage of faster cooling of the work pieces which results in higher utilization of the oven and shorter cycle times.

In another embodiment of the invention the shell is formed of a non-magnetic material and is adapted to receive the rack and to be sealed to form a tightly sealed processing environment when the rack is in the shell. In this embodiment the rack has two plates that are joined by wafer support pillars that have slots for receiving wafer-shaped work pieces. There are two plate fluid conduits, each in contact with one of the two plates and adapted to receive heating and/or cooling fluid. An external heater is disposed outside of the shell to heat the processing environment and an external magnet is disposed outside of the shell to induce a magnetic field in the work pieces. A vacuum pump is also attached to the shell to create a vacuum within the processing environment.

In another embodiment this invention provides for repressurization of the shell with a backfill gas. The backfill gas may be filtered or otherwise treated to ensure that particulates or other foreign matter is not introduced into the processing environment and allowed to contaminate the work pieces upon repressurization.

In another embodiment, essentially the same structure is used but the shell flange and seal flange cooperate to form a rotatable vacuum flange. Once the work pieces are treated and cooled but before the vacuum is removed, the rack can be rotated to a second position and a second magnetic orientation may be provided to the work pieces by repeating the heating and magnetizing steps while in this second position. The orientation is again preserved by cooling and the work pieces are unloaded.

The invention is also directed to a method of heat treating work pieces. One embodiment of the method comprises loading work pieces onto a rack and placing the rack into a shell. The rack has at least one plate and there is at least one plate fluid conduit in contact with the plate. The shell is then sealed with a seal flange and a vacuum is created by a vacuum pump that is attached to the shell. A heater then increases the temperature of the work pieces in the processing environment. These conditions are maintained until the work pieces are treated as desired. The temperature of the work pieces is then reduced by passing a cooling fluid through the plate fluid conduit. In this way the work pieces can be more quickly cooled in a vacuum environment through conductive and radiant heat transfer from the work pieces to the rack. Once the work pieces have cooled sufficiently the vacuum is reduced, the rack is removed from the processing environment, and the work pieces are removed from the rack.

The invention is also directed at a method of magnetically annealing work pieces. One embodiment of the method comprises loading work pieces onto a rack and placing the rack into a shell. The rack has at least one plate and there is at least one plate fluid conduit in contact with the plate. The shell is then sealed with a seal flange and a vacuum is created by a vacuum pump that is attached to the shell. A heater then increases the temperature of the work pieces and a magnet increases the magnetic field in the processing environment. These conditions are maintained until the work pieces assume a desired magnetic orientation. The temperature of the work pieces is then reduced by passing a cooling fluid through the plate fluid conduit. In this way the work pieces can be more quickly cooled in a vacuum environment through conductive and radiant heat transfer from the work pieces to the rack. Once the work pieces have cooled sufficiently the vacuum and magnetic field are reduced, the rack is removed from the processing environment, and the work pieces are removed from the rack.

A further embodiment useful for magnetic annealing comprises essentially the process of the preceding paragraph, which is then repeated with the work pieces in a second position to impart a second magnetic orientation to the work pieces. This repositioning and repeating of the annealing process can be repeated to impart several orientations on the work pieces if that is desired.

DETAIL DESCRIPTION

Figure 1:
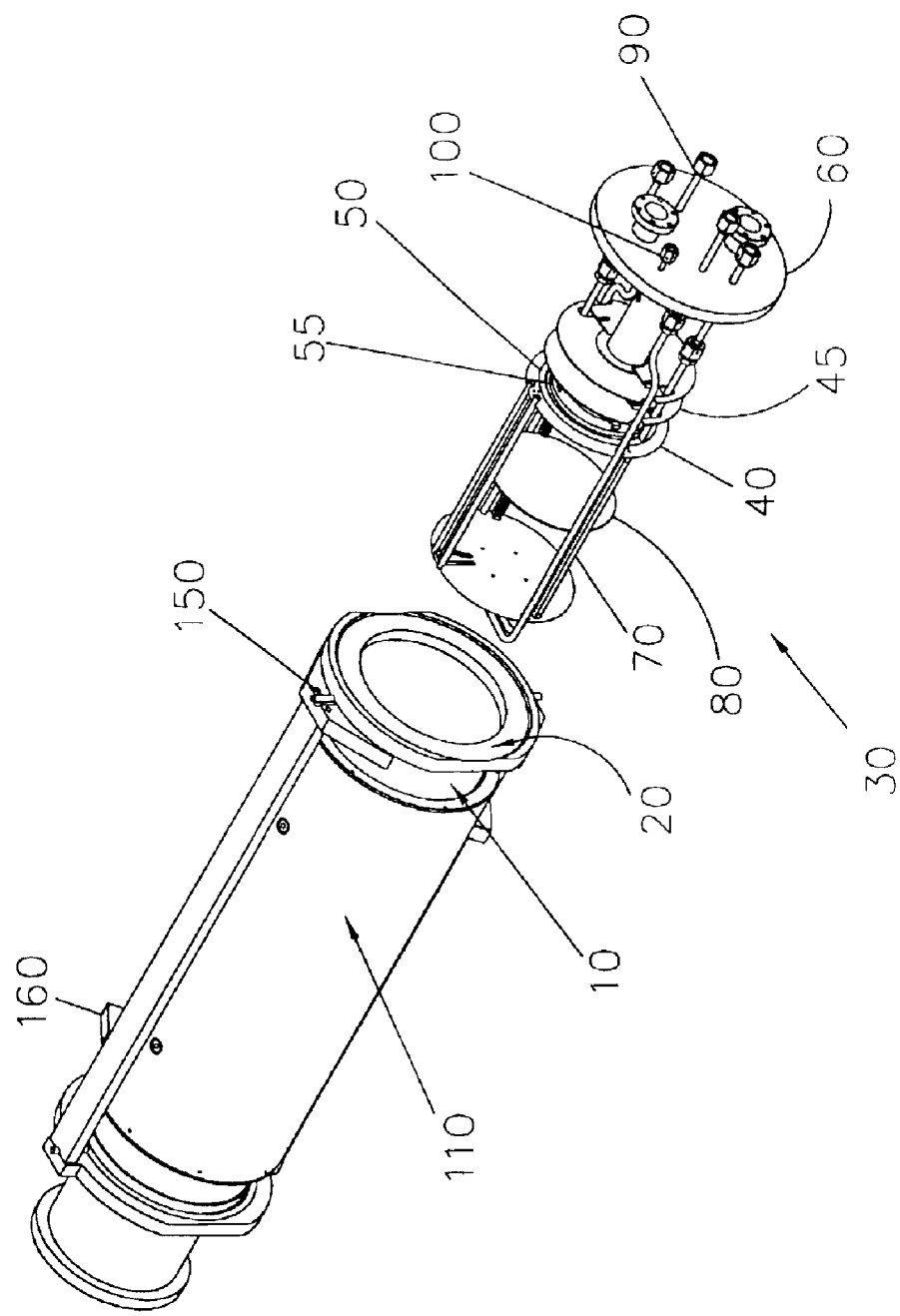
FIG. 1 is an isometric view of the shell and rack assembly according to the invention.

With reference to FIG. 1, the oven of the invention is generally comprised of a shell 10, a rack 30 for supporting work pieces, a vacuum pump 120 (shown in FIG. 2), a plate fluid conduit 50 attached to a manifold 90, and a magnet 115 (shown in FIG. 2) located exterior to the shell.

The shell 10 has an opening and defines a processing environment. A shell flange 20, covers the shell opening and has an opening for receiving a rack 30 into the processing environment of the shell 10. The shell 10 and shell flange 20 may be made of materials of sufficient strength to withstand a high vacuum, since vacuums of greater than $10^{-7}$ Torr are common in heat treating applications. Non-magnetic materials are preferred for magnetic annealing ovens. Suitable non-magnetic materials for use in magnetic annealing applications include but are not limited to stainless steel, silver, copper, titanium, composites or alloys of these metals, and quartz. Magnetic or non-magnetic materials may be used for applications other than magnetic annealing. The shell 10 is generally cylindrical, but other shapes may also be utilized.

The rack 30 is connected to a seal flange 60. The seal flange 60 is configured to form a tight seal with the shell flange 20 when the rack 30 is installed in the shell 10. Passing through the seal flange 60 is a manifold 90. The rack 30 may be connected to the seal flange 60 independently of the manifold 90 or the connection between the two may be the manifold itself.

The seal flange 20 may include an elastomeric seal 65 (shown in FIG. 4) to improve the quality of the closure. These elastomeric seals may be sensitive to heat and may deteriorate over numerous processing cycles, which can diminish the oven's ability to maintain a vacuum. A shell flange fluid loop 150 protects the elastomeric seal by cooling the flange joint with a heat transfer fluid. The shell flange fluid loop 150 comprises a passageway through the shell flange 20 through which a cooling fluid for removing heat from the shell flange 20 may flow, and an inlet and an outlet for providing and removing the cooling fluid.

The rack 30 normally has two plates 40 connected by pillars 70, although any number of plates and pillars could be used. For magnetic annealing applications, the plates and pillars are formed of non-magnetic, thermally conductive material. For applications other than magnetic annealing, the plates may be formed of either magnetic or non-magnetic thermally conductive material. The plates may be a relatively flat, rigid body of any shape or size and sized so rack 30 can be inserted into shell 10 and opening of seal flange 20. The pillars 70 are adapted to receive work pieces 80 generally in the form of wafers or disks, although material or work pieces of any shape could be treated with the oven of the invention by designing the rack 30 and the pillars 70 to accommodate differently shaped work pieces 80.

A plate fluid conduit 50 is in contact with at least one of the plates 40. The plate fluid conduit 50 may be used to circulate a cooling fluid to cool the plates 40 after heat treatment is completed or after a magnetic orientation has been imparted to the work pieces. The cooling fluid is provided to the plate fluid conduit through the manifold 90 which passes through the seal flange 60. The manifold 90 can be connected to a source of heat transfer fluid external to the processing environment. The work pieces 80 may thus be cooled through conductive heat transfer along the pillars 70 to the plates 40 and radiant heat transfer to the plates 40 and the pillars 70. The plate fluid conduit 50 may also be used to heat the plates 40 and the work pieces 80 during the annealing process.

Also passing through the seal flange is back fill gas piping 100, which allows for the introduction of treated or untreated gas into the shell 10 while the shell is sealed. The back fill gas piping 100 may be used to reintroduce atmosphere into the shell 10 after vacuum treatment. In the event that the vacuum conditions alone do not provide a sufficiently anaerobic atmosphere, the backfill gas piping 100 may be used to introduce inert gases into the shell 10 to reduce the potential for oxidation of the work pieces 80.

Figure 2:
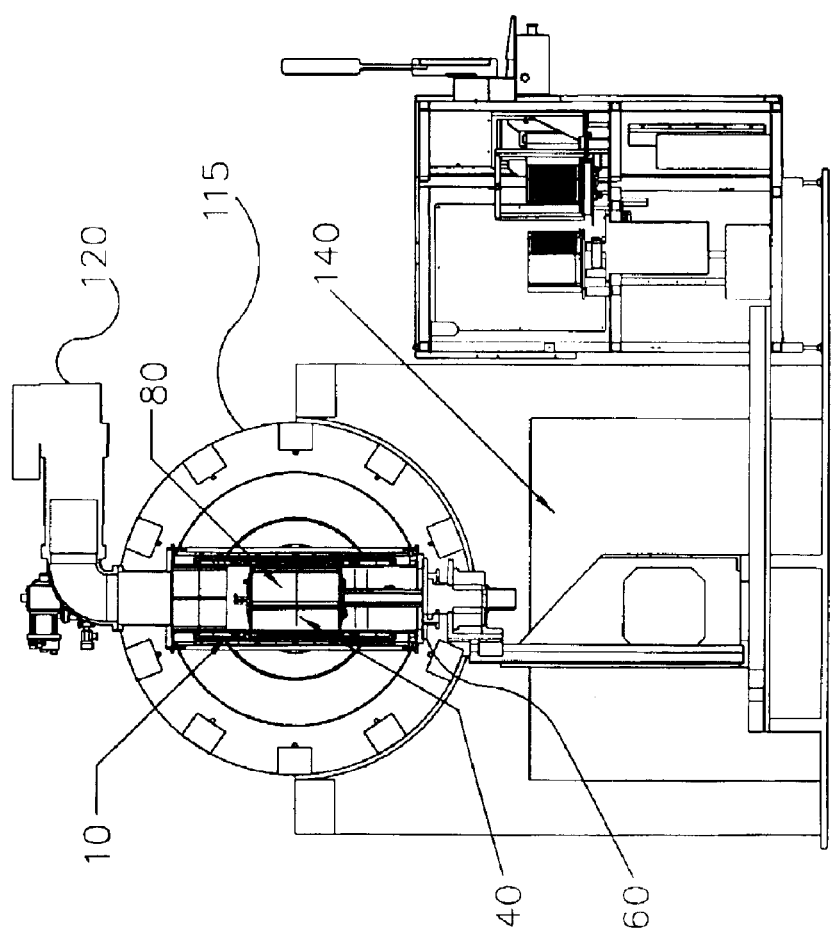
FIG. 2 is a sectional plan view of an oven according to the invention.

Referring now to FIG. 2, a vacuum pump 120 is connected to the shell 10 for creating a vacuum within the sealed shell 10. It does not matter where the vacuum pump 120 is attached to the shell 10, but for magnetic applications it is best that it is attached to the shell 10 in such a way as to provide room for the magnet 115 to be positioned close to the shell. In embodiments where the shell 10 is cylindrical, the vacuum pump 120 may be attached to either end of the shell 10. Vacuum pumps useful in the invention include, but are not limited to, turbo-molecular pumps and cryo-pumps. Turbo-molecular pumps are magnetically levitated and are sensitive to external magnetic fields. In FIG. 2, a magnet 115 is located outside of the shell 10 for the purpose of inducing a magnetic field in the work pieces 80. The magnetic field generated by the magnet 115 can disturb the magnetic levitation and create damaging internal friction when the pump 120 is a turbo-molecular pump. Because of this effect of the magnet 115 on turbo-molecular pumps, cryo-pumps are preferred for magnetic annealing applications since they can be located in close proximity to the magnet 115 without an adverse impact.

The magnet 115 may be a permanent magnet, an electromagnet, a superconducting electromagnet, or others known in the art. The type of magnet utilized will depend in part on the desired field strength. When wafer-shaped work pieces are being treated, the magnet is oriented so that the magnetic flux lines are parallel to the plane of the wafers being treated. Since electromagnets and superconducting electromagnets consume large amounts of energy to generate magnetic fields of greater than one Tesla, the shell 10 is preferably compact for magnetic applications so as to minimize the distance through which the magnetic field must be induced.

The magnet 115 is spaced away from the shell 10 to minimize the risk of conductive heat transfer from the shell 10 or the heater 110 to the magnet 115. Exposing the magnet 115 to heat may cause undesirable variations in the magnetic field and result in a loss of uniformity of both the magnetic field generated and the work pieces treated by the oven. The field generated by a magnet situated away from the shell 10 as described can be uniform within ±2% with a divergence angle of <2°.

Figure 3:
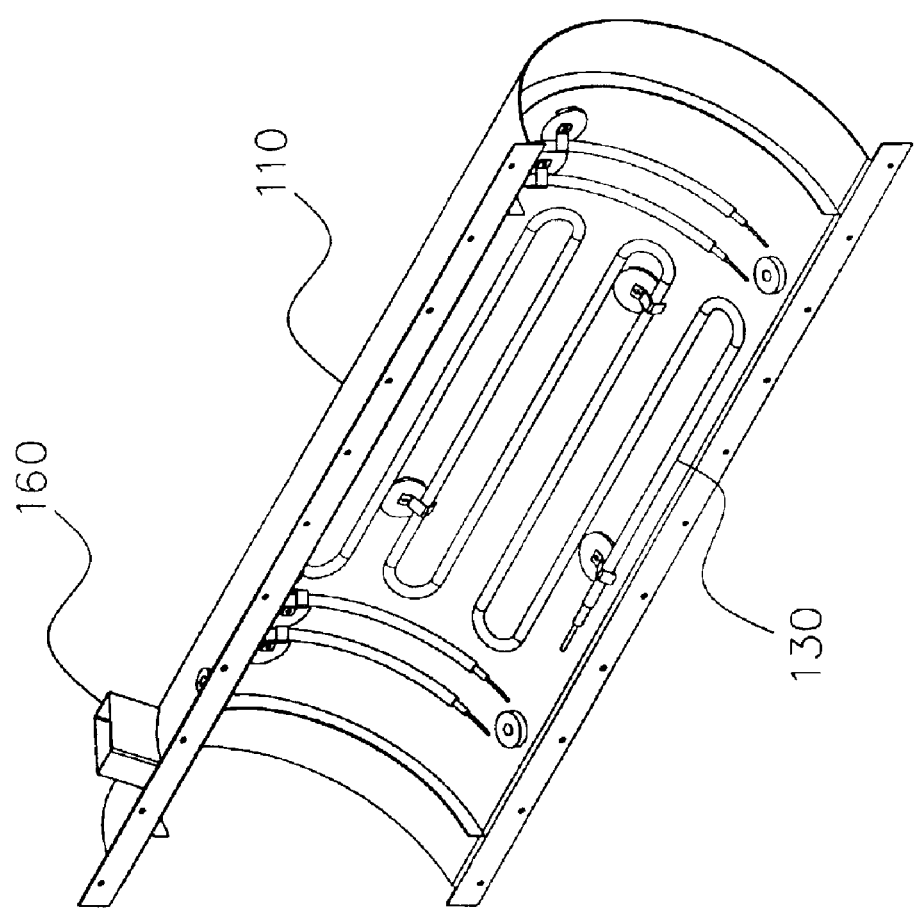
FIG. 3 is an isometric view of the external heater according to the invention

With reference to FIGS. 1 and 3, heating of the work pieces may be accomplished with an external heater 110, by electrical resistance heaters in contact with the plates, by passing a heating fluid through the plate fluid conduit 50 to heat the plate 40, or by a combination thereof. Untreated, heated air is an acceptable heating fluid for the plate fluid conduit 50, but other fluids can also be utilized. One example of an external heater 110 is shown in FIG. 3 as an electric resistance heater with three separately controllable elements 130. For magnetic applications, the heater 110 could also be formed of non-magnetic materials. Sensors can be installed within the shell 10 and connected to controllers that are well-known in the art to provide uniform temperature gradients within the shell 10, limiting variations to less than ±1° C. in a vacuum environment if such tolerances are required. Of course, any type of heater known in the art could be used for the external heater 110.

With reference to FIG. 1, reflective shields 45 may be located at either end of the rack to prevent heat loss which may damage other components of the machine and to help control the temperature profile within the shell 10. In magnetic applications, the shield should be non-magnetic and have a heat reflective surface with an emissivity of 0.05 or less. Silver and gold are preferred materials for the reflective shield in magnetic applications. The shell 10 may also be held at a more uniform temperature by circulating hot gas through the cooling fluid portals 160 of heater 110 which surrounds the shell 10.

Cooling of the work pieces may be accomplished by passing a cooling fluid over the exterior of the shell 10 through the cooling fluid portals 160. Cooling may also be accomplished by passing a cooling fluid through the plate fluid conduit 50 to cool the plate 40. The cooling of the plate 40 draws heat form the work pieces 80 by radiant transfer to the plate 40 and through conductive transfer along the pillars 70 to the plate 40. The cooling fluid used to cool both the plate 40 and the exterior of the shell 10 may be cooled or ambient air, although other fluids can also be utilized. This combination of cooling and heating methods advantageously allows for faster processing times.

Rotation of the work pieces may be desired to impart more than one magnetic orientation to the work pieces. In these instances the shell flange 20 and the seal flange 60 may be configured to form and operate as a rotatable vacuum joint. Such joints can be rotated without breaking the vacuum formed within the processing environment. In this manner the rack 30 can be rotated within the shell 10 while the vacuum within the shell 10 is maintained, allowing for a much quicker annealing of work pieces with more than one magnetic orientation. Vacuum joints of this kind are well known in the art and may comprise a Ferrofluidic® type seal containing a magnet and magnetic fluid in a seal with a labyrinth path between the vacuum side and the external environment, a seal with multiple O-rings and a vacuum drawn between the O-rings, or other variations known in the art. Alternatively, additional orientations could also be provided to the material by decreasing the vacuum and breaking the seal, rotating the rack, and repeating the annealing steps. However, this method may be more time consuming and/or manually intensive than using a vacuum joint.

Figure 4:
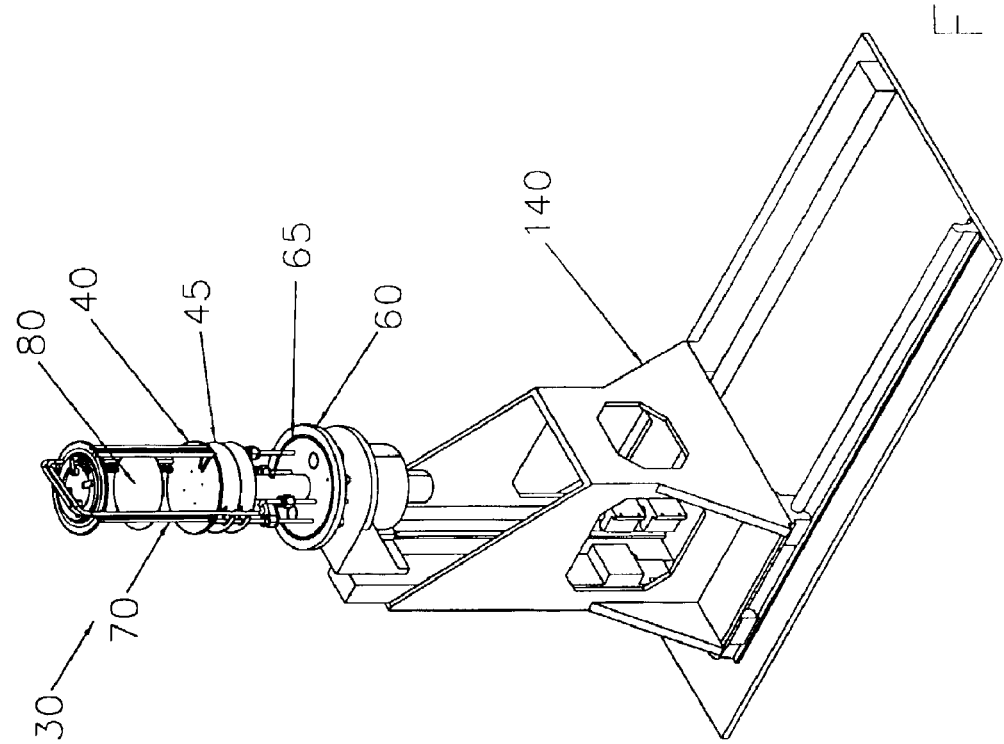
FIG. 4 is an isometric view of the gantry in the extended position according to the invention.
Figure 5:
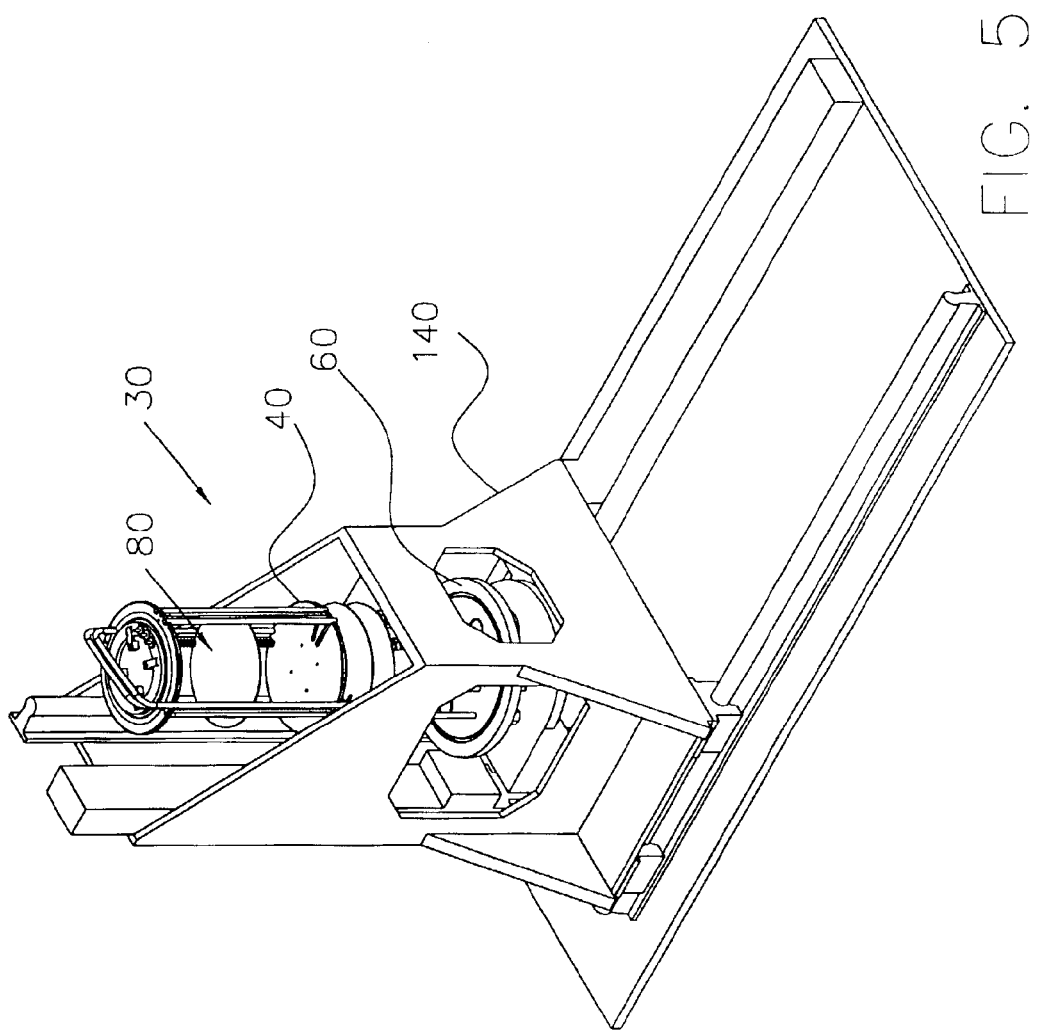
FIG. 5 is an isometric view of the gantry in the retracted position according to the invention.

Referring now to FIGS. 4 and 5, a gantry 140 may be employed to move the rack 30 and seal flange 60 assembly, from a loading station, into position to be installed into the shell 10. FIG. 4 shows the rack 30 in a relative installed position without the surrounding oven structure. FIG. 5 shows the rack 30 in a retracted position from where it could be installed in the shell 10 (not shown in FIG. 5) or moved to a loading/reorientation station. Once the treatment of the work pieces 80 is complete, the rack 30 can be removed from the shell and conveyed via the gantry 140 to a position where treated work pieces 80 can be removed from the rack 30 and replaced with untreated work pieces 80. When the oven is not provided with a rotatable vacuum joint, the rack 30 can conveyed via the gantry 140 to a reorientation position remote from the shell 10 and be rotated into another position to allow for reinstallation into the shell 10 and annealing of the work pieces 80 with a second orientation.

The invention is also directed to methods for the magnetic and non-magnetic annealing of work pieces 80. An embodiment of the method of the invention involves loading work pieces 80 into a rack 30 where they are supported by pillars 70. The rack 30 is then placed in a shell 10. The shell is then scaled with a seal flange 60 to form a tight sealed processing environment. The vacuum in the environment is then increased by a vacuum pump 120 and the temperature of the work pieces is increased by one or more external heaters located outside of the shell and/or by passing a heating fluid through the plate fluid conduit 50 and heating the plate 40. For non-magnetic annealing, once the desired processing temperature is reached it is maintained for a prescribed time. If staged heating is required, this may be repeated with serial or staged temperature increases.

For magnetic annealing, a magnet 115 located outside of the shell 10 then increases the magnetic field in the processing environment to a desired level. These conditions are maintained for a time appropriate for imparting the desired magnetic orientation to the work pieces 80.

Once the desired heat treatment and/or orientation is achieved, the work pieces are cooled by passing a cooling fluid through the plate fluid conduit 50 that is in contact with the plate 40. Heat is removed from the work pieces through radiant transfer to the cooled plate 40 and through conductive transfer through the pillars 70 to the plate 40. The exterior of the shell 10 may also be cooled by passing a cooling fluid through the shell cooling portal 160 and over the surface of the shell 10.

In magnetic annealing applications, the magnetic field is decreased and removed after the work pieces are cooled sufficiently to preserve the desired orientation. After cool down, atmosphere is reintroduced to the processing chamber of shell 10 either through the vacuum pump 120 or the back fill piping 100 to reduce the vacuum. The rack 30 is then removed from the processing environment. A gantry 140 moves the rack 30 to a position where the work pieces 80 can be removed from the rack and new work pieces can be loaded onto the rack.

For applications where at least a second orientation is to be imparted to the work pieces, the rack 30 is rotated from a first position to a second position once the work pieces are cooled and the magnetic field is decreased. The work pieces are then heated, the magnetic field reapplied, and the second orientation is provided to the work pieces. This sequence may be repeated for additional orientations as required.

While exemplary embodiments of this invention and methods of practicing the same have been illustrated and described, it should be understood that various changes, adaptations, and modifications may be made therein without departing from the spirit of the invention and the scope of the appended claims.

What is claimed is:

1. An apparatus comprising:
    a) a shell having a shell opening, the shell defining a processing environment;
    b) a shell flange covering the shell opening, the shell flange having an opening to the processing environment;
    c) a rack for supporting work pieces, the rack having at least one plate, and the rack being sized to be received through the opening and within the processing environment;
    d) a plate fluid conduit adapted to receive heating and/or cooling fluid, the plate fluid conduit being in contact with the at least one plate; and
    e) a vacuum flange configured to form a tight seal with the shell flange when the rack is received in the processing environment.

2. The apparatus of claim 1, wherein the rack has at least two plates, the plates being joined by pillars.

3. The apparatus of claim 2, wherein each plate is in contact with a plate fluid conduit.

4. The apparatus of claim 2, wherein the pillars are wafer support pillars, the wafer support pillars having slots for receiving work pieces.

5. The apparatus of claim 1, wherein a manifold is connected to the at least one plate.

6. The apparatus of claim 5, wherein the manifold is configured to circulate fluid though the plate fluid conduit that is in contact with the at least one plate.

7. The apparatus of claim 1, further comprising back fill gas piping configured to introduce gas into the processing environment.

8. The apparatus of claim 1, further comprising back fill gas piping configured to circulate gas through the processing environment.

9. The apparatus of claim 1, further comprising at least one external heater disposed on the outside of the shell for heating the processing environment.

10. The apparatus of claim 1, further comprising a heater in contact with the at least one plate.

11. The apparatus of any of claims 1–8, further comprising a vacuum pump attached to the shell for creating a vacuum within the processing environment.

12. The apparatus of any of claims 1–8, wherein the shell flange is in contact with a shell flange fluid loop which has an inlet and an outlet.

13. The apparatus of any of claims 1–8, further comprising at least one external heater disposed on the outside of the shell for heating the processing environment.

14. The apparatus of claim 1, further comprising an external magnet positioned to induce a magnetic field in the processing environment.

15. The apparatus of claim 1, wherein the work pieces are generally planar and further comprising an external magnet positioned to induce a magnetic field along the plane of the work pieces held in the rack.

16. The apparatus of claim 1, further comprising:
    a) an external heater disposed outside of the shell for heating the processing environment; and
    b) a vacuum pump attached to the shell for creating a vacuum in the processing environment; wherein
    c) the rack has at least a first plate and a second plate, the plates being joined by support pillars attached to the first and second plates, the support pillars having slots for receiving and holding work pieces, and the rack being sized to be received through the shell flange opening and into the processing environment of the shell;
    d) the plate fluid conduit is in contact with the first plate and a second plate fluid conduit is in contact with the second plate; and
    e) the vacuum flange has a manifold connected to and passing through the vacuum flange, the manifold configured to circulate fluid through the plate fluid conduits.

17. The apparatus of any one of claims 5–10, or 16, wherein any combination of the rack, manifold, vacuum flange, shell flange, external heater and/or the shell is made of non-magnetic material.

18. The apparatus of claim 14, wherein the shell is made of quartz.

19. The apparatus of claim 14, wherein the shell is capable of maintaining a vacuum of at least $10^{-7}$ Torr.

20. The apparatus of claim 14, further comprising back fill gas piping configured to introduce gas into the processing environment.

21. The apparatus of claim 14, further comprising back fill gas piping configured to circulate gas through the processing environment.

22. The apparatus of claim 14, further comprising an external magnet positioned to induce a magnetic field in the processing environment.

23. The apparatus of claim 14, wherein the work pieces are generally planar and further comprising an external magnet positioned to induce a magnetic field along the plane of the work pieces held in the rack.

24. The apparatus of either claim 22 or 23, wherein the magnet is capable of inducing a magnetic field of at least 0.25 Tesla in the work pieces held in the rack.

25. The apparatus of any one of claims 14–15, 22 or 23, wherein the shell flange and the vacuum flange comprise a rotatable vacuum joint for rotating the rack to allow additional magnetic orientations to be imparted to the work pieces without compromising the tight seal.

26. The apparatus of any one of claim 1 or 16, further comprising means for removing the rack from the processing environment and moving the rack to a location where loading and unloading of the work pieces can be accomplished.

27. A process comprising:
a) loading work pieces onto a rack, the rack comprising at least one plate and a plate fluid conduit in contact with the at least one plate;
b) placing the rack into a shell, the shell defining a processing environment, wherein one end of the shell is covered by a shell flange secured to the shell, the shell flange having an opening for receiving the rack into the processing environment, and wherein the other end of the shell is attached to a vacuum pump;
c) sealing the processing environment with a seal flange which is configured to form a tight seal with the shell flange when the rack is placed in the processing environment, the seal flange further having a manifold passing through it which is connected to the plate fluid conduit;
d) creating a vacuum in the processing environment with the vacuum pump;
e) increasing the temperature of the work pieces;
f) maintaining the vacuum and temperature until the work pieces are treated;
g) decreasing the temperature of the work pieces by passing a cooling fluid through the plate fluid conduit and by cooling the exterior of the shell;
h) decreasing the vacuum to gradually reintroduce atmosphere within the processing environment;
i) removing the rack from the processing environment; and
j) removing the work pieces from the rack.

28. A process comprising:
a) loading work pieces onto a rack, the rack comprising at least one plate and a plate fluid conduit in contact with the at least one plate;
b) placing the rack into a shell, the shell defining a processing environment, wherein one end of the shell is covered by a shell flange secured to the shell, the shell flange having an opening for receiving the rack into the processing environment, and wherein the other end of the shell is attached to a vacuum pump;
c) sealing the processing environment with a seal flange which is configured to form a tight seal with the shell flange when the rack is placed in the processing environment, the seal flange further having a manifold passing through it which is connected to the plate fluid conduit;
d) creating a vacuum in the processing environment with the vacuum pump;
e) increasing the temperature of the work pieces;
f) increasing the magnetic field in the processing environment to a desired field strength with an external magnet disposed outside of the shell;
g) maintaining the vacuum, temperature, and magnetic field until the work pieces assume a desired magnetic orientation;
h) decreasing the temperature of the work pieces by passing a cooling fluid through the plate fluid conduit and by cooling the exterior of the shell;
i) decreasing and removing the magnetic field;
j) decreasing the vacuum to gradually reintroduce atmosphere within the processing environment;
k) removing the rack from the processing environment; and
l) removing the work pieces from the rack.

29. A process comprising:
a) loading work pieces onto a rack, the rack comprising at least one plate and a plate fluid conduit in contact with the at least one plate;
b) placing the rack into a shell, the interior of the shell defining a processing environment, wherein one end of the shell is covered by a shell flange secured to the shell, the shell flange having an opening for receiving the rack into the processing environment, and wherein the other end of the shell is attached to a vacuum pump;
c) sealing the processing environment with a seal flange which is configured to form a rotatable vacuum joint with the shell flange when the rack is placed in the processing environment, the seal flange further having a manifold passing through it which is connected to the plate fluid conduit;
d) creating a vacuum in the processing environment with the vacuum pump;
e) increasing the temperature of the work pieces;
f) increasing the magnetic field in the processing environment to a desired field strength with an external magnet disposed outside of the shell;
g) maintaining the vacuum, temperature, and magnetic field until the work pieces assume a desired magnetic orientation;
h) decreasing the temperature of the work pieces by passing a cooling fluid through the plate fluid conduit;
i) decreasing and removing the magnetic field;
j) rotating the rack from a first position to a second position;
k) increasing the temperature of the work pieces;
l) increasing the magnetic field in the processing environment to a desired field strength with an external magnet disposed outside of the shell;
m) maintaining the vacuum, temperature, and magnetic field until the work pieces assumes a desired magnetic orientation;
n) decreasing the temperature of the work pieces by passing a cooling fluid through the plate fluid conduit;
o) decreasing and removing the magnetic field;
p) decreasing the vacuum to gradually reintroduce atmosphere within the processing environment;
q) removing the rack from the processing environment; and
r) removing the work pieces from the rack.

30. The process of any one of claims 27, 28, or 29, wherein the temperature of the work pieces is increased by passing a heating fluid through the plate fluid conduit.

31. The process of any one of claims 27, 28, or 29, wherein the temperature of the work pieces is increased by use of one or more external heaters disposed outside of the shell.

32. The process of any one of claims 27, 28, or 29, wherein the temperature of the work pieces is increased by use of one or more external heaters disposed outside of the shell and by passing a heating fluid through the plate fluid conduit.

33. The process of any one of claims 27, 28, or 29, wherein the vacuum is reduced through the addition of gas through back fill gas piping.

34. The process of any one of claims 27, 28, or 29, wherein the work pieces are generally planar and the external magnet is positioned to induce a magnetic field along the plane of the work pieces held in the rack.

35. The process of any one of claims 27, 28, or 29, wherein the rack is removed from the processing environment with a gantry capable of moving the rack to a position suitable for loading and unloading.

36. The process of any one of claims 27 or 28, further comprising the step of rotating the work pieces from a first position to at least a second position to provide at least a second magnetic orientation to the work pieces.

* * * * *